(12) United States Patent
Jeong

(10) Patent No.: US 8,772,815 B2
(45) Date of Patent: Jul. 8, 2014

(54) SEMICONDUCTOR LIGHT EMITTING DEVICE HAVING A PROTECTING MEMBER AND METHOD OF FABRICATING THE SAME

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 384 days.

(21) Appl. No.: 12/445,182

(22) PCT Filed: Dec. 17, 2008

(86) PCT No.: PCT/KR2008/007475
§ 371 (c)(1),
(2), (4) Date: Apr. 10, 2009

(87) PCT Pub. No.: WO2009/082121
PCT Pub. Date: Jul. 2, 2009

(65) Prior Publication Data
US 2010/0187558 A1    Jul. 29, 2010

(30) Foreign Application Priority Data
Dec. 20, 2007  (KR) .................. 10-2007-0133918

(51) Int. Cl.
*H01L 33/00* (2010.01)

(52) U.S. Cl.
USPC  257/99; 257/98; 257/E33.006; 257/E33.065; 257/E33.067; 257/E33.074

(58) Field of Classification Search
USPC ............... 257/98, 99, E33.006, E33.065, 257/E33.067, E33.074
See application file for complete search history.

(56) References Cited

U.S. PATENT DOCUMENTS

| | | | |
|---|---|---|---|
| 6,320,209 B1 * | 11/2001 | Hata et al. | 257/190 |
| 6,744,196 B1 * | 6/2004 | Jeon | 313/498 |
| 2003/0087467 A1 | 5/2003 | Oohata et al. | |
| 2004/0031967 A1 | 2/2004 | Fudeta et al. | |
| 2004/0048409 A1 | 3/2004 | Biwa et al. | |
| 2004/0245540 A1 * | 12/2004 | Hata et al. | 257/99 |
| 2005/0145865 A1 | 7/2005 | Okuyama et al. | |
| 2005/0277218 A1 | 12/2005 | Nakajo et al. | |
| 2007/0145382 A1 | 6/2007 | Choi et al. | |
| 2008/0251808 A1 * | 10/2008 | Kususe et al. | 257/98 |

FOREIGN PATENT DOCUMENTS

| | | |
|---|---|---|
| JP | 09-232675 A | 9/1997 |
| JP | 2000-068593 A | 3/2000 |
| JP | 2001-244503 A | 9/2001 |
| JP | 2004-165683 A | 6/2004 |
| JP | 2005-277374 A | 10/2005 |
| JP | 2006-210961 A | 8/2006 |
| KR | 10-2007-0044099 A | 4/2007 |

OTHER PUBLICATIONS

English translation for Japanese 2001-244503-A.
English translation for Japanese 2004-165683-A.
English translation for Japanese 2006-210961-A.
English Translation of KR 10-2007-0044099.

* cited by examiner

*Primary Examiner* — Robert Huber
(74) *Attorney, Agent, or Firm* — Birch, Stewart, Kolasch & Birch, LLP

(57) ABSTRACT

A semiconductor light emitting device has a light emitting structure including a first conductive semiconductor layer, an active layer on the first conductive semiconductor layer, and a second conductive semiconductor layer on the active layer, and a nitride semiconductor layer on side surfaces of the second conductive semiconductor layer along an outer periphery of the second conductive semiconductor layer. An ohmic layer directly contacts the second conductive semiconductor layer and the nitride semiconductor layer.

3 Claims, 4 Drawing Sheets

SEMICONDUCTOR LIGHT EMITTING DEVICE HAVING A PROTECTING MEMBER AND METHOD OF FABRICATING THE SAME

TECHNICAL FIELD

The present disclosure relates to a semiconductor light emitting device and a method of fabricating the same.

BACKGROUND ART

Group III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device. In particular, light emitting devices using group III nitride semiconductors have a direct transition-type bandgap corresponding to the range from visible rays to ultraviolet rays, and can perform high-efficiency light emission.

The nitride semiconductor is mainly used for the LED (Light Emitting Diode) or an LD (laser diode), and studies have been continuously conducted to improve the fabrication process or light efficiency of the nitride semiconductor.

DISCLOSURE OF INVENTION

Technical Problem

Embodiments provide a semiconductor light emitting device comprising a nitride semiconductor layer around a light emitting structure, and a method of fabricating the same.

Embodiments also provide a semiconductor light emitting device comprising an active layer on an outer periphery of a light emitting structure, and a method for manufacturing the same.

Technical Solution

An embodiment provides a semiconductor light emitting device comprising: a light emitting structure comprising a first conductive semiconductor layer, an active layer on the first conductive semiconductor layer, and a second conductive semiconductor layer on the active layer; a nitride semiconductor layer on an outer periphery of the second conductive semiconductor layer; and an ohmic layer on the second conductive semiconductor layer.

An embodiment provides a semiconductor light emitting device comprising: a first conductive semiconductor layer; an active layer on top and side surfaces of the first conductive semiconductor layer; a second conductive semiconductor layer on top and side surfaces of the active layer; a nitride semiconductor layer on an outer periphery of the second conductive semiconductor layer; and an ohmic layer on the second conductive semiconductor layer and the nitride semiconductor layer.

An embodiment provides a method of fabricating a semiconductor light emitting device comprising: forming a first conductive semiconductor layer on a substrate; sequentially forming an active layer and a second conductive semiconductor layer on the first conductive semiconductor layer; forming a nitride semiconductor layer in an outer periphery of the second conductive semiconductor layer; forming an ohmic layer on the second conductive semiconductor layer and the nitride semiconductor layer; forming a conductive support member on the ohmic layer; and removing the substrate.

Advantageous Effects

Embodiments can enhance the luminous efficiency of the semiconductor light emitting device.

Embodiments can enhance the fabrication process of the semiconductor light emitting device.

Embodiments can separate the light emitting structure from a metal material by a nitride semiconductor layer formed around an outer periphery of the light emitting structure.

BEST MODE FOR CARRYING OUT THE INVENTION

Hereinafter, a semiconductor light emitting device and a method of fabricating the same according to the embodiment will be described with reference to the accompanying drawings.

In the description of the embodiment, it will be understood that, when a layer (or film), a region, a pattern, or a structure is referred to as being "on(above/over/upper)" or "under(below/down/lower)" another substrate, another layer (or film), another region, another pad, or another pattern, it can be directly on the other substrate, layer (or film), region, pad or pattern, or intervening layers may also be present.

Figure 1:
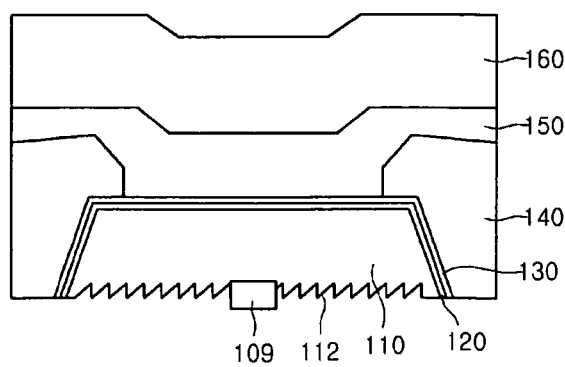
FIG. 1 is a side sectional view of a semiconductor light emitting device according to a first embodiment.

FIG. 1 is a side sectional view of a semiconductor light emitting device according to a first embodiment. In the description of the first embodiment, the creterion for "on" or "under" of each layer will be described with reference to the relevant drawings. The thickness of each layer is merely exemplary and is not limited by the thickness illustrated in the drawings.

Referring to FIG. 1, a semiconductor light emitting device 100 comprises a first conductive semiconductor layer 110, an active layer 120, a second conductive semiconductor layer 130, a nitride semiconductor layer 140, an ohmic layer 150, and a conductive support member 160.

The first conductive semiconductor layer 110 is doped with a first conductive dopant. The first conductive semiconductor layer 110 may be formed of one of group III-V compound semiconductors, for example, GaN, InN, AlN, InGaN, AlGaN, InAlGaN, and AlInN. When the first conductive semiconductor layer 110 is an N-type semiconductor layer, the first conductive dopant is an N-type dopant, such as Si, Ge, Sn, Se, or Te.

A first electrode 109 is formed under the first conductive semiconductor layer 110. The first electrode 109 may be formed in a predetermined pattern, but the present invention is not limited thereto. Also, a roughness 112 having a predetermined shape may be formed under the first conductive semiconductor layer 110. The roughness 112 may comprise a pyramid-shaped pattern or a concave-convex pattern.

The first conductive semiconductor layer 110 may be formed to a predetermined thickness in a polyhedral shape such as a hexahedron, a polygonal prism shape, a cylinder shape, or a random shape. Furthermore, the side of the first conductive semiconductor layer 110 may be formed in a right angle shape with respect to a horizontal line or may be sloped.

The active layer 120 is formed on the first conductive semiconductor layer 110. The active layer 120 is formed along the top and side surfaces of the first conductive semiconductor layer 110. The active layer 120 may have a single quantum well structure or a multiple quantum well structure. The active layer 120 may be formed of an InGaN well layer/GaN barrier layer or an AlGaN well layer/GaN barrier layer by using group III-V compound semiconductors.

The active layer 120 is formed of a material having a bandgap energy according to a light wavelength at which light is emitted. For example, in the case of a blue light emission having a wavelength range from 460 nm to 470 nm, the active layer 120 may be formed in a single or multiple quantum well structure at a period of an InGaN well layer/GaN barrier layer. The active layer 120 may comprise a material emitting a colored light such as a blue wavelength light, a red wavelength light, and a green wavelength light. A conductive clad layer may be formed on an/or under the active layer 120. The conductive clad layer comprises an AlGaN-based layer. Furthermore, another semiconductor layer may be stacked on and/or under the active layer 120, but the present invention is not limited thereto.

At least one second conductive semiconductor layer 130 is formed on the active layer 120. The second conductive semiconductor layer 130 is formed along the top and side surfaces of the active layer 120. The second conductive semiconductor layer 130 may be formed with a semiconductor layer doped with a second conductive dopant. The second conductive semiconductor layer 130 may be formed of one of group III-V compound semiconductors, for example, GaN, InN, AlN, InGaN, AlGaN, InAlGaN, and AlInN. When the second conductive semiconductor layer 130 is a P-type semiconductor layer, the second conductive dopant may comprise a P-type dopant, such as Mg, Zn, Ca, Sr, or Ba.

In addition, an N-type semiconductor layer (not shown) or a P-type semiconductor layer (not shown) may be formed on the second conductive semiconductor layer 130. The first conductive semiconductor layer 110, the active layer 120, and the second conductive semiconductor layer 130 may be defined as a light emitting structure. The light emitting structure may be formed in an N-P junction structure, a P-N junction structure, an N-P-N junction structure, or a P-N-P junction structure.

The active layer 120 is disposed along the top and side surfaces of the first conductive semiconductor layer 110 and the second conductive, semiconductor layer 130. Accordingly, the luminous efficiency of the semiconductor light emitting device 100 may be enhanced.

The nitride semiconductor layer 140 is formed along an outer periphery of the second conductive semiconductor layer 130. The nitride semiconductor layer 140 may be formed in a portion of the side surface of the second conductive semiconductor layer 130, or may be formed in a whole side surface of the second conductive semiconductor layer 130, or may extend from the side surface to a portion of the top surface of the second conductive semiconductor layer 130.

The nitride semiconductor layer 140 may be doped with a first conductive dopant or a second conductive dopant and may be formed of one of group compound semiconductors, for example, GaN, InN, AlN, InGaN, AlGaN, InAlGaN, and AlInN. Also, the nitride semiconductor layer 140 may not be doped with a conductive dopant.

The nitride semiconductor layer 140 is formed in an outer periphery of the light emitting structure 110, 120 and 130 and protects the outer periphery of the light emitting structure 110, 120 and 130.

The ohmic layer 150 may be formed on the second conductive semiconductor layer 130, or may be formed on the second conductive semiconductor layer 130 and the nitride semiconductor layer 140.

The ohmic layer 150 ohmic-contacts the second conductive semiconductor layer 130 and the nitride semiconductor layer 140, and serves as a metal seed for the conductive support member 160.

The ohmic layer 150 may be formed of at least one or selective mixture of indium tin oxide (ITO), Pt, Ni, Au, Rh, Pd, Ag, Al, and Ir. The ohmic layer 150 may be deposited in a single layer or multi layer. The ohmic layer 150 may be formed of, but is not limited to, a material having an ohmic characteristic, a reflection characteristic, and a metal seed characteristic.

The conductive support member 160 may be selectively formed on the ohmic layer 150 by using a conductive material, for example, copper, gold, or carrier wafer (e.g., Si, Ge, GaAs, ZnO, SiC, etc.). Also, the conductive support member 160 may be formed using a copper plating or wafer bonding technology, but the present invention is not limited thereto. The top surface of the conductive support member 160 may be flattened through a planarization process.

According to the first embodiment, the surface area of the active layer 120 can be increased by forming the first conductive semiconductor layer 110 in a polyhedral shape or a prism shape. Accordingly, the luminous efficiency of the semiconductor light emitting device 100 can be enhanced.

Furthermore, end portions of the active layer 120 and the second conductive semiconductor layer 130 may be exposed in the downward direction of the first conductive semiconductor layer 110.

Moreover, the nitride semiconductor layer 140 is formed along the outer periphery of the second conductive semiconductor layer 130 and protects the outer periphery of the light emitting structure 110, 120 and 130. For example, the nitride semiconductor layer 140 separates an outside gap between the light emitting structure 110, 120 and 130 and the ohmic layer 150 or the conductive support member 160. The outside gap between the light emitting structure 110, 120 and 130 and the ohmic layer 150 or the conductive support member 160 prevents the outside of the light emitting structure 110, 120 and 130 from contacting a metal component.

FIGS. 2 through 8 are sectional views illustrating a method of fabricating a semiconductor light emitting device according to a first embodiment.

Figure 2:
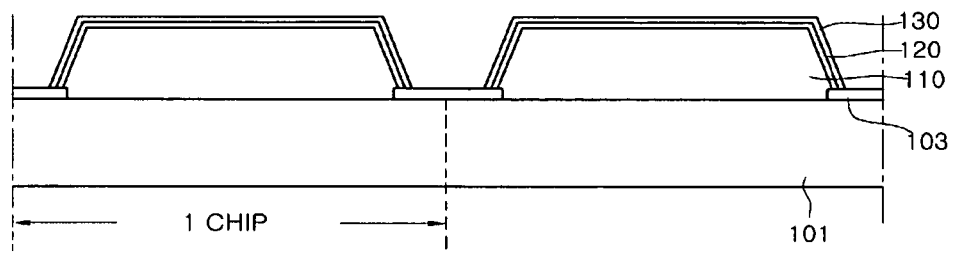
FIGS. 2 through 8 are sectional views illustrating a method of fabricating a semiconductor light emitting device according to a first embodiment.

Referring to FIG. 2, first mask patterns 103 are formed in a chip boundary region on a substrate 101. The chip boundary region may be an outer region of a chip or a region between light emitting structures.

The substrate 101 may be selected from the group consisting of a sapphire substrate ($Al_2O_3$), GaN, SiC, ZnO, Si, GaP, InP, and GaAs. The chip boundary region may be defined as a region between chips or a region between the light emitting structures.

The first mask pattern 103 is formed along the chip boundary region. The first mask pattern 103 may be formed of, but is not limited to, $SiO_2$, $SiO_x$, $SiN_{x2}$, $SiN_x$, or $SiO_xN_y$. The first mask pattern 103 is formed to a predetermined thickness (for example, 1,000 Å to 5,000 Å).

A buffer layer (not shown) and/or an undoped semiconductor layer (not shown) may be formed on the substrate 101. The buffer layer (not shown) may be formed of group III-V compound semiconductors, for example, GaN, InN, AlN, InGaN, AlGaN, InAlGaN, or AlInN. A dopant may be doped into the buffer layer (not shown). The undoped semiconductor layer (not shown) may be implemented with an undoped GaN-based layer. In this case, the first mask pattern 103 may be formed before or after forming the buffer layer (not shown) and/or the undoped semiconductor layer (not shown). Such a structure may be modified.

A first conductive semiconductor layer 110 is formed on the substrate 101 between the first mask patterns 103. A region for the light emitting structure may be defined between the first mask patterns 103.

The first conductive semiconductor layer 110 may be doped with a first conductive dopant and may be formed of one of group III-V compound semiconductors, for example, GaN, InN, AlN, InGaN, AlGaN, InAlGaN, and AlInN. When the first conductive semiconductor layer 110 is an N-type semiconductor layer, the first conductive dopant is an N-type dopant, such as Si, Ge, Sn, Se, or Te.

The first conductive semiconductor layer 110 may be formed between the first mask patterns 103 in a predetermined shape, for example, a polyhedral shape such as a hexahedron, a cylinder shape, a polygonal prism shape, or a random shape, but the present invention is limited thereto. The first conductive semiconductor layer 110 may be formed in a thickness range of 4.0 μm to 7.0 um.

The outer periphery of the first conductive semiconductor layer 110 may be sloped or perpendicular to the top surface of the substrate.

An active layer 120 is formed on the first conductive semiconductor layer 110. The active layer 120 is formed along the top and side surfaces of the first conductive semiconductor layer 110. The active layer 120 may have a single quantum well structure or a multiple quantum well structure. The active layer 120 may be formed of, but is not limited to, an InGaN well layer/GaN barrier layer or an AlGaN well layer/GaN barrier layer by using group compound semiconductors.

A second conductive semiconductor layer 130 is formed on the active layer 120. The second conductive semiconductor layer 130 is formed along the top and side surfaces of the active layer 120. The second conductive semiconductor layer 130 may be formed with a semiconductor layer doped with a second conductive dopant. The second conductive semiconductor layer 130 may be formed of one of group III-V compound semiconductors, for example, GaN, InN, AlN, InGaN, AlGaN, InAlGaN, or AlInN. When the second conductive semiconductor layer 130 is a P-type semiconductor layer, the second conductive dopant may comprise a P-type dopant, such as Mg, Zn, Ca, Sr, or Ba.

End portions of the first conductive semiconductor layer 110, the active layer 120, and the second conductive semiconductor layer 130 may be formed on the first mask patterns 103.

In addition, an N-type semiconductor layer (not shown) or a P-type semiconductor layer (not shown) may be formed on the second conductive semiconductor layer 130. The first conductive semiconductor layer 110, the active layer 120, and the second conductive semiconductor layer 130 may be defined as a light emitting structure. The light emitting structure may be formed in one of an N-P junction structure, a P-N junction structure, an N-P-N junction structure, and a P-N-P junction structure.

Since the light emitting structure 110, 120 and 130 has the top surface and the outer periphery, the light emitting area can be increased.

After forming the second conductive semiconductor layer 130, the first mask patterns 103 are removed by an etching process (e.g., a wet etching process). The first mask pattern 103 may be removed in a process of separating the substrate 101, and the removal order of the first mask patterns 103 may be changed.

Figure 3:
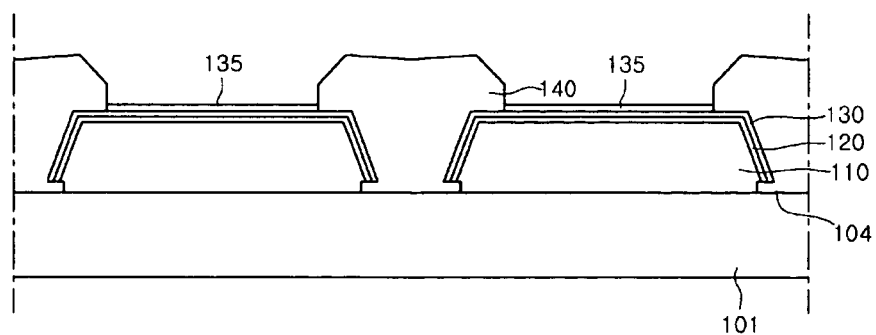

Referring to FIGS. 2 and 3, after the first mask patterns 103 are removed, second mask patterns 135 are formed in an inner region on the second conductive semiconductor layer 130. The second mask patterns 135 may be formed in an upper inner side of the second conductive semiconductor layer 130 or regions other than the chip boundary region.

The second mask patterns 135 may be formed of, but are not limited to, $SiO_2$, $SiO_x$, $SiN_{x2}$, $SiN_x$, or $SiO_xN_y$.

The nitride semiconductor layer 140 is formed in a region where the second mask patterns 135 are not formed. The nitride semiconductor layer 140 is formed on the substrate 101 and may be formed up to the side of the second conductive semiconductor layer 130 and a portion of the top surface thereof. The nitride semiconductor layer 140 may be formed in a portion of the side of the second conductive semiconductor layer 130 on the substrate 101.

Furthermore, the bottom of the nitride semiconductor layer 140 may be formed in the first mask pattern region 104.

The nitride semiconductor layer 140 may be formed to a thickness equal to or greater than that of the light emitting structure 110, 120 and 130, for example, 2 um to 8 um. Also, the nitride semiconductor layer 140 may be formed in a range of ±2~8 μm with respect to the thickness of the light emitting structure 110, 120 and 130.

The nitride semiconductor layer 140 may be doped with a first conductive dopant or a second conductive dopant and may be formed of one of group III-V compound semiconductors, for example, GaN, InN, AlN, InGaN, AlGaN, InAlGaN, and AlInN. Also, the nitride semiconductor layer 140 may be formed of semiconductors which are not doped with a conductive dopant.

The nitride semiconductor layer 140 is formed in an outer periphery of the light emitting structure 110, 120 and 130 and thus protects the outer periphery of the light emitting structure 110, 120 and 130.

Since the nitride semiconductor layer 140 is formed in the boundary region between the light emitting structures 110, 120 and 130, it is unnecessary to perform a process of forming and removing a separate passivation layer.

After the nitride semiconductor layer 140 is formed, the second mask patterns 135 are removed by a wet etching process and/or a dry etching process.

Figure 4:
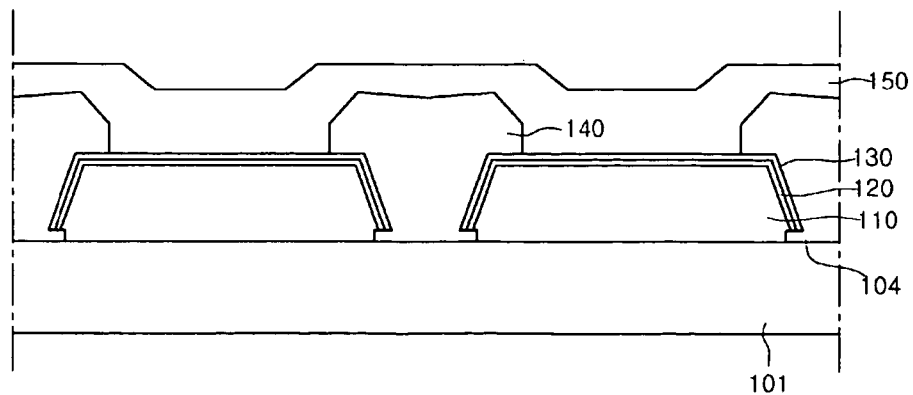

Referring to FIGS. 3 and 4, after the second mask patterns 135 are removed, an ohmic layer 150 is formed on the second conductive semiconductor layer 130 and the nitride semiconductor layer 140.

The ohmic layer 150 may be formed of at least one or selective mixture of indium tin oxide (ITO), Pt, Ni, Au, Rh, Pd, Ag, Al, and Ir. The ohmic layer 150 may be deposited in a single layer or multi layer. The ohmic layer 150 may be formed of, but is not limited to, a material having an ohmic characteristic, a reflection characteristic, and a metal seed characteristic.

Figure 5:
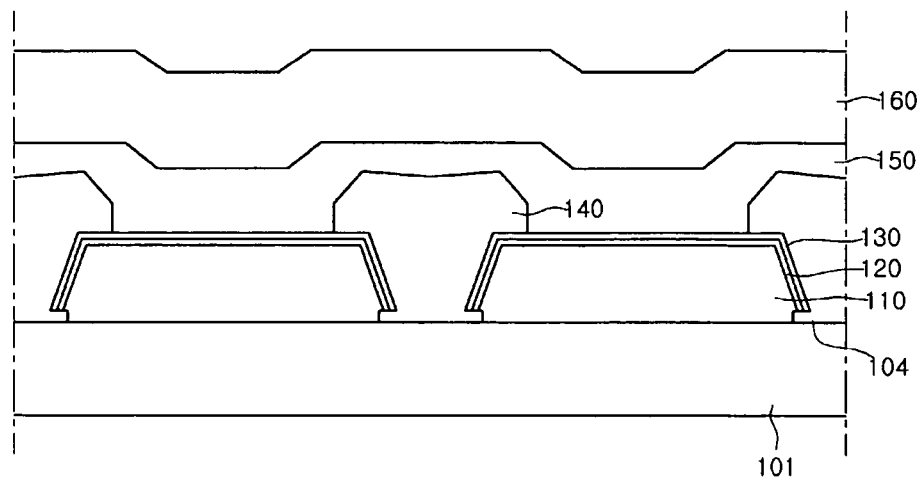

Referring to FIGS. 4 and 5, a conductive support member 160 may be selectively formed on the ohmic layer 150. The conductive support member 160 may be formed of a conductive material, for example, copper, gold, or carrier wafer (e.g., Si, Ge, GaAs, ZnO, SiC, etc.) to a predetermined thickness (for example, 30 μm to 150 um). The top surface of the conductive support member 160 may be flattened through a planarization process. The planarization process may be performed by a cutting or polishing process.

Figure 6:
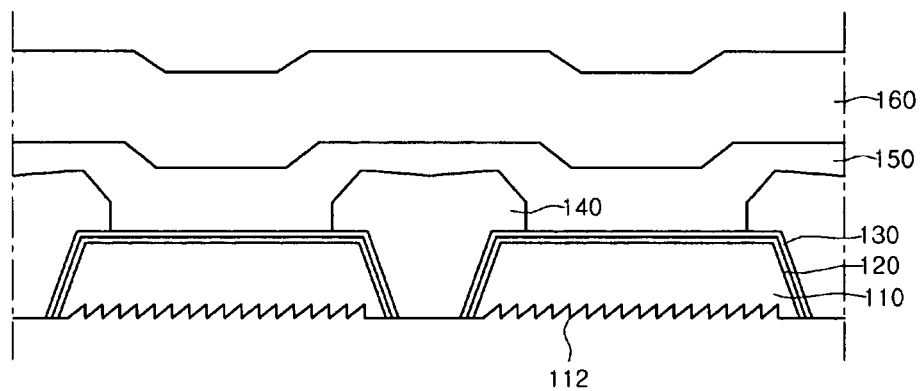

Referring to FIGS. 5 and 6, the substrate 101 is removed by a physical method and/or a chemical method. The physical method may separate the substrate 101 by a laser lift off (LLO) method, and the chemical method can separate the buffer layer and the substrate 101 by injecting a wet etchant into the buffer layer (not shown).

When the substrate 101 is removed, the bottoms of the first conductive semiconductor layer 110 and the nitride semiconductor layer 140 are exposed. At this point, a surface pretreatment process is performed on the first conductive semiconductor layer 110 and the nitride semiconductor layer 140. The surface pretreatment thickness may remove more than the thickness of the first mask pattern 103 of FIG. 2.

The surface pretreatment process may be performed by a wet etching process using BOE, HF, HCl or KOH solution and/or a dry etching process such as ICP and RIE. At this point, the bottom of the first conductive semiconductor layer 110 is etched to form a roughness 112. Also, a roughness (not shown) may be formed on the nitride semiconductor layer 140. The size and shape of the roughness 112 may be different according to etching degree, and the roughness 112 may not be formed.

Figure 7:
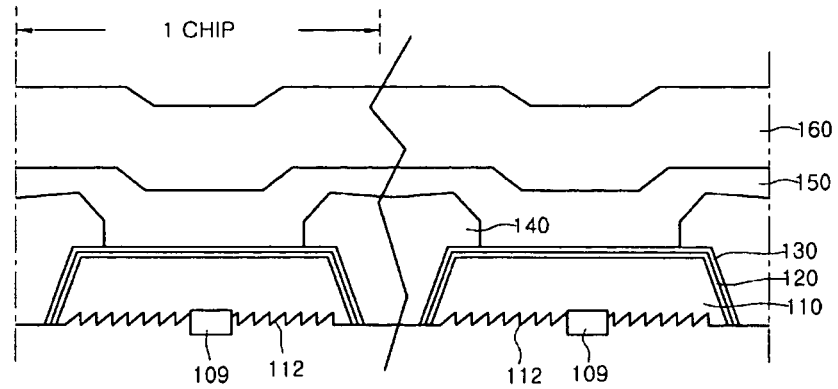
Figure 8:
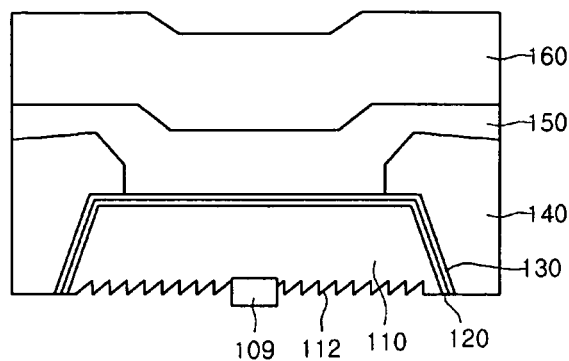

Referring to FIGS. 7 and 8, a first electrode 109 is formed on the bottom surface of the first conductive semiconductor layer 110 in a predetermined pattern. That is, after the substrate is removed from the bottom surface of the first conductive semiconductor layer 110, the first conductive semiconductor layer 110 is arranged so that the bottom surface of the first conductive semiconductor layer 110 turn upward. The first electrode 109 may be formed on the first conductive semiconductor layer 110.

After the first electrode 109 is formed, the chip boundary region comprising the conductive support member 160 and the nitride semiconductor layer 140 is separated along a chip size by using a laser scriber. In this case, a separate dry etching may not be performed on the side of the chip. Moreover, the dry etching can be performed ac cording to need.

The light emitting structure 110, 120 and 130 comprises the first conductive semiconductor layer 110, the active layer 120, and the second conductive semiconductor layer 130, and is disposed in an inner region defined by the nitride semiconductor layer 140 and the ohmic layer 150.

Furthermore, the surface area of the active layer 120 can be increased by forming the first conductive semiconductor layer 110 in a polyhedral shape or a prism shape. Accordingly, the luminous efficiency of the semiconductor light emitting device 100 can be enhanced.

Furthermore, end portions of the active layer 120 and the second conductive semiconductor layer 130 may be exposed in the downward direction of the first conductive semiconductor layer 110.

Moreover, the nitride semiconductor layer 140 is formed along the outer periphery of the second conductive semiconductor layer 130 and protects the outer periphery of the light emitting structure 110, 120 and 130.

FIGS. 9 through 12 are sectional views illustrating a method of fabricating a semiconductor light emitting device according to a second embodiment. In the first and second embodiments, like reference numerals refer to like elements and duplicate description will be omitted.

Figure 9:
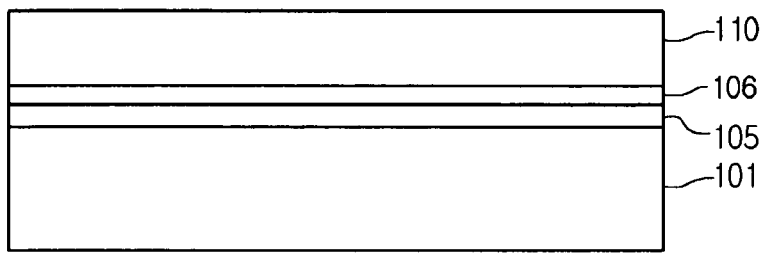
FIGS. 9 through 12 are sectional views illustrating a method of fabricating a semiconductor light emitting device according to a second embodiment.

Referring to FIG. 9, a buffer layer 105, an undoped semiconductor layer 106, and a first conductive semiconductor layer 110 are sequentially formed on the substrate 101. The buffer layer 105, the undoped semiconductor layer 106, and the first conductive semiconductor layer 110 may be formed to a thickness of 1 um to 5 um.

The buffer layer 105 may be formed one of group III-V compound semiconductors, for example, GaN, InN, AlN, InGaN, AlGaN, InAlGaN, and AlInN and may be doped with a dopant. The undoped semiconductor layer 106 may be implemented with an undoped GaN-based layer.

Figure 10:
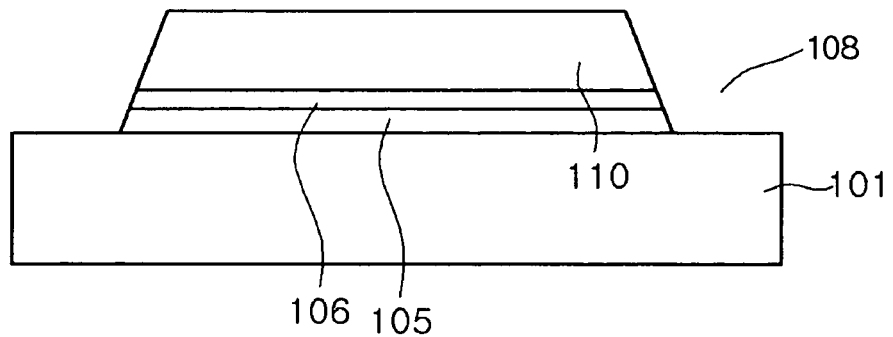

Referring to FIGS. 9 and 10, a dry etching process (e.g., ICP) is performed on a chip boundary region 108 on the substrate 101. in this case, the top surface of the substrate 101 is exposed in the chip boundary region 108. At this point, sides of the buffer layer 105, the undoped semiconductor layer 106, and the first conductive semiconductor layer 110 may be etched to be sloped or perpendicular to the top surface of the substrate 101.

A 1A conductive semiconductor layer 110A is re-grown on the first conductive semiconductor layer 110 and the substrate 101. The 1A conductive semiconductor layer 110A is doped with a first conductive dopant and may be formed of group III-V compound semiconductor. The 1A conductive semiconductor layer 110A may be implemented with an N-type semiconductor layer.

The 1A conductive semiconductor layer 110A is formed from the top surface of the substrate 101 to the top surface of the first conductive semiconductor layer 110. The 1A conductive semiconductor layer 110A may be formed to have a height difference along the chip boundary area and the first conductive semiconductor layer 110.

Figure 11:
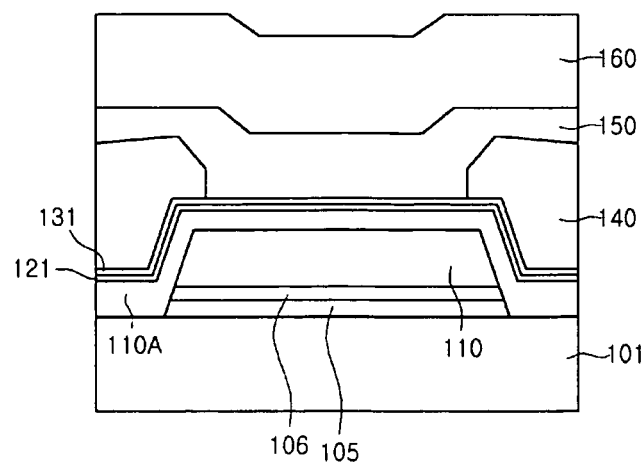

Referring to FIGS. 10 and 11, an active layer 121 and a second conductive semiconductor layer 131 are formed on the 1A conductive semiconductor layer 110A. The active layer 121 and the second conductive semiconductor layer 131 are formed along the curved surface of 1A conductive semiconductor layer 110A. That is, the active layer 121 and the second conductive semiconductor layer 131 may be formed along the inner upper surface, side surface and outer top surface of the 1A conductive semiconductor layer 110A.

Second mask patterns (not shown, 135 in FIG. 3) are formed on the second conductive semiconductor layer 131, and a nitride semiconductor layer 140 is formed on the second conductive semiconductor layer 131 of the chip boundary area. The second mask patterns (not shown) are removed.

An ohmic layer 150 and a conductive support member 160 are formed on the second conductive semiconductor layer 131 and the nitride semiconductor layer 140.

Figure 12:
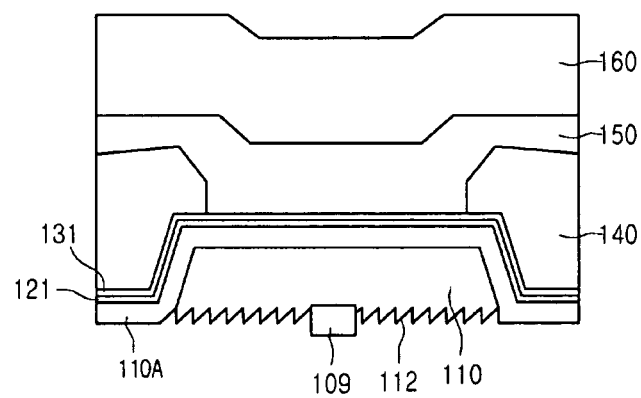

Referring to FIGS. 11 and 12, the substrate 101 may be removed by a physical method and/or a chemical method. A pre-treatment is performed on the surface of a resulting structure where the substrate is removed. The buffer layer (105 in FIG. 9) and the undoped semiconductor layer (106 in FIG. 9) are removed by the pre-treatment, and the bottom surface of the first conductive semiconductor layer 110 and the outer bottom surface of the 1A conductive semiconductor layer 110A are exposed.

A roughness 112 is formed on the bottom surface of the first conductive semiconductor layer 110, and a first electrode 109 is formed. Thast is, after the substrate is removed from the bottom surface of the first conductive semiconductor layer 110, the first conductive semiconductor layer 110 is arranged so that the bottom surface of the first conductive semiconductor layer 110 turn upward. The first electrode 109 may be formed on the first conductive semiconductor layer 110. Accordingly, a semiconductor light emitting device 100B separated in a chip size is fabricated. The light emitting structure comprises the first conductive semiconductor layer 110, the 1A conducive semiconductor layer 110A, the active layer 121, and the second conductive semiconductor layer 131, and the outer periphery of the semiconductor light emitting structure extends up to the bottom of the nitride semiconductor layer 140.

In the semiconductor light emitting device 100B according to the second embodiment, the 1A conductive semiconductor layer 110A is formed on the first conductive semiconductor layer 110, and the 1A conductive semiconductor layer 110A extends outward in a stepped shape. Accordingly, since the 1A conductive semiconductor layer 110A, the active layer 120, and the second conductive semiconductor layer 130 extend outward in the stepped shape, the luminous efficiency can be enhanced.

Furthermore, since the nitride semiconductor layer is formed around the chip, it is unnecessary to form a passivation layer such as a separate insulation layer. Moreover, since the nitride semiconductor layer is formed at the outside of the light emitting structure, the fabrication process can be simplified without reducing the light emitting area.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can provide a semiconductor light emitting device.

Embodiments can increase the light emitting area of the semiconductor light emitting device.

Embodiments can enhance the fabrication process of the semiconductor light emitting device.

The invention claimed is:

1. A semiconductor light emitting device comprising:
a first conductive semiconductor layer;
an active layer on top and side surfaces of the first conductive semiconductor layer;
a second conductive semiconductor layer on top and side surfaces of the active layer;
a semiconductor layer having a nitride material on side surfaces of the second conductive semiconductor layer along an outer periphery of the second conductive semiconductor layer;
a conductive layer directly contacting the second conductive semiconductor layer and the semiconductor layer having the nitride material; and
a conductive substrate on the conductive layer,
wherein a portion of a bottom surface of the semiconductor layer is coplanar with a bottom surface of the first conductive semiconductor layer,
wherein the conductive layer is disposed between the semiconductor layer and the conductive substrate, and
wherein light from the active layer is emitted to the outside from a bottom surface of the first conductive semiconductor layer.

2. The semiconductor light emitting device according to claim 1, wherein the conductive layer comprises at least one or mixture of indium tin oxide (ITO), Pt, Ni, Au, Rh, Pd, Ag, Al, and Ir.

3. The semiconductor light emitting device according to claim 1, wherein the first conductive semiconductor layer is formed to a thickness of 4 um to 7 um, and the semiconductor layer is formed to a thickness of 2 um to 8 um.

* * * * *